US012690459B2

(12) United States Patent
Shah et al.

(10) Patent No.: US 12,690,459 B2
(45) Date of Patent: Jul. 21, 2026

(54) DEVICE PACKAGES WITH INTEGRATED BATTERIES

(71) Applicant: NXP USA, Inc., Austin, TX (US)

(72) Inventors: Ankur Shailesh Shah, Chandler, AZ (US); Michael B. Vincent, Chandler, AZ (US); Scott M Hayes, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 413 days.

(21) Appl. No.: 18/391,911

(22) Filed: Dec. 21, 2023

(65) Prior Publication Data

US 2025/0210545 A1    Jun. 26, 2025

(51) Int. Cl.
| | |
|---|---|
| *H10W 42/00* | (2026.01) |
| *H10W 74/01* | (2026.01) |
| *H10W 74/10* | (2026.01) |
| *H10W 76/12* | (2026.01) |
| *H10W 90/00* | (2026.01) |
| *H10W 95/00* | (2026.01) |

(52) U.S. Cl.
CPC ........... *H10W 42/00* (2026.01); *H10W 74/01* (2026.01); *H10W 74/114* (2026.01); *H10W 90/754* (2026.01)

(58) Field of Classification Search
CPC ..... H10W 42/00; H10W 76/12; H10W 95/00; H10W 74/114
See application file for complete search history.

(56) References Cited

U.S. PATENT DOCUMENTS

| | | | |
|---|---|---|---|
| 4,992,987 A | 2/1991 | Echols et al. | |
| 4,998,888 A | 3/1991 | Link et al. | |
| 5,403,782 A | 4/1995 | Dixon et al. | |
| 5,498,903 A | 3/1996 | Dixon et al. | |
| 2005/0129989 A1 | 6/2005 | Edwards | |
| 2005/0262929 A1* | 12/2005 | Felton | B81C 1/0023 73/104 |

(Continued)

FOREIGN PATENT DOCUMENTS

JP          H03080561 A      4/1991

OTHER PUBLICATIONS

China application 202311839389.4 with English Specifications; 37 pages (Dec. 28, 2023).

(Continued)

*Primary Examiner* — Mohsen Ahmadi

(57) ABSTRACT

Electronic device packages that allow batteries to be incorporated in the package directly above or below semiconductor die or other devices can enable reduced package footprints while also protecting batteries against exposure to undesirable high temperatures during assembly of the package and protecting molded portions of the package from stresses that may arise from swelling of the battery over its useful lifetime. One terminal of the battery is bonded a conductive lead integrated within a molded cover by an electrically conductive bond. Bonding the cover to a circuit board or other substrate also electrically couples to battery terminal to a contact on the substrate. The other terminal of the batter can be bonded to another contact on the substrate using a suitable conductive bond such as one formed by an electrically conductive adhesive.

16 Claims, 5 Drawing Sheets

(56)     References Cited

U.S. PATENT DOCUMENTS

| 2012/0056329 | A1* | 3/2012 | Pagaila | H10W 90/00 |
| | | | | 438/109 |
| 2012/0280374 | A1* | 11/2012 | Choi | H10W 42/20 |
| | | | | 257/659 |
| 2015/0137338 | A1* | 5/2015 | Lin | H10W 46/00 |
| | | | | 257/676 |
| 2017/0077022 | A1* | 3/2017 | Scanlan | H10W 70/65 |
| 2017/0229322 | A1* | 8/2017 | Hsu | H10W 74/019 |
| 2017/0236808 | A1 | 8/2017 | Balut et al. | |
| 2018/0203495 | A1 | 7/2018 | Campbell et al. | |
| 2018/0337160 | A1* | 11/2018 | Drab | H10W 90/00 |
| 2021/0265225 | A1* | 8/2021 | Jang | H10W 76/13 |
| 2021/0272862 | A1 | 9/2021 | Bowers et al. | |
| 2024/0038606 | A1* | 2/2024 | Bowers | H10P 72/74 |

OTHER PUBLICATIONS

U.S. Appl. No. 18/521,895; not yet published; 30 pages (Nov. 28, 2023).

* cited by examiner

DEVICE PACKAGES WITH INTEGRATED BATTERIES

TECHNICAL FIELD

Embodiments of the subject matter described herein relate to integrated circuits and electronic device packages that include batteries that are external to the integrated circuits.

BACKGROUND

Integrated circuits are frequently encapsulated within molded packages configured to protect the integrated circuits and/or to provide macroscopic electrical connections. Many such integrated circuits devices are produced in high volumes to drive costs down. In example manufacturing processes, multiple semiconductor devices can be manufactured as a strip or a sheet and then "singulated" through cutting processes that separate each device from the others. The composite product of such processes, known as a "package," may comprise active and passive microelectronic components, integrated circuits, bonding wires, etc., mounted on a printed circuit board (PCB) or other substrate.

Many of these devices are powered by a battery that, due to size constraints for devices in these applications, must be very small. Non-rechargeable lithium 3V "button batteries," ranging in size from about 10 mm to about 30 mm in diameter, are commonly used due to their low cost, high commercial availability, and relatively high capacity-to-volume ratio. Typically, the battery is installed after fabrication of the package, and is externally mounted via a socket, tabs or clips, or other conductive mounting assembly.

SUMMARY

In an example embodiment, a device package includes a carrier substrate having an upper surface and a lower surface that includes a first electrical contact and a second electrical contact, The device package also includes an electronic device die bonded to upper surface or the lower surface of the carrier substrate. The electronic device is electrically coupled to the first electrical contact and the second electrical contact. The device package also includes a molded cover bonded to the carrier substrate that forms a cavity above the upper surface of the carrier substrate; a battery having a first terminal bonded to the molded cover and a second terminal; and a first conductive lead embedded within the molded cover that electrically couples the first terminal of the battery to the first contact pad.

In another example embodiment, a method of forming a device package includes receiving a carrier substrate having an upper surface and a lower surface, and bonding a molded cover to the carrier substrate that forms a cavity above the upper surface of the carrier substrate. The carrier substrate includes: a first electrical contact and a second electrical contact; and an electronic device die bonded to upper surface or the lower surface of the carrier substrate. The electronic device is electrically coupled to the first electrical contact and electrically coupled to the second electrical contact. A battery having a first and a second terminal is bonded to the molded cover within the cavity; and a first conductive lead is embedded within the molded cover that electrically couples the first terminal of the battery to the first contact pad.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein.

DETAILED DESCRIPTION

Figure 1A:
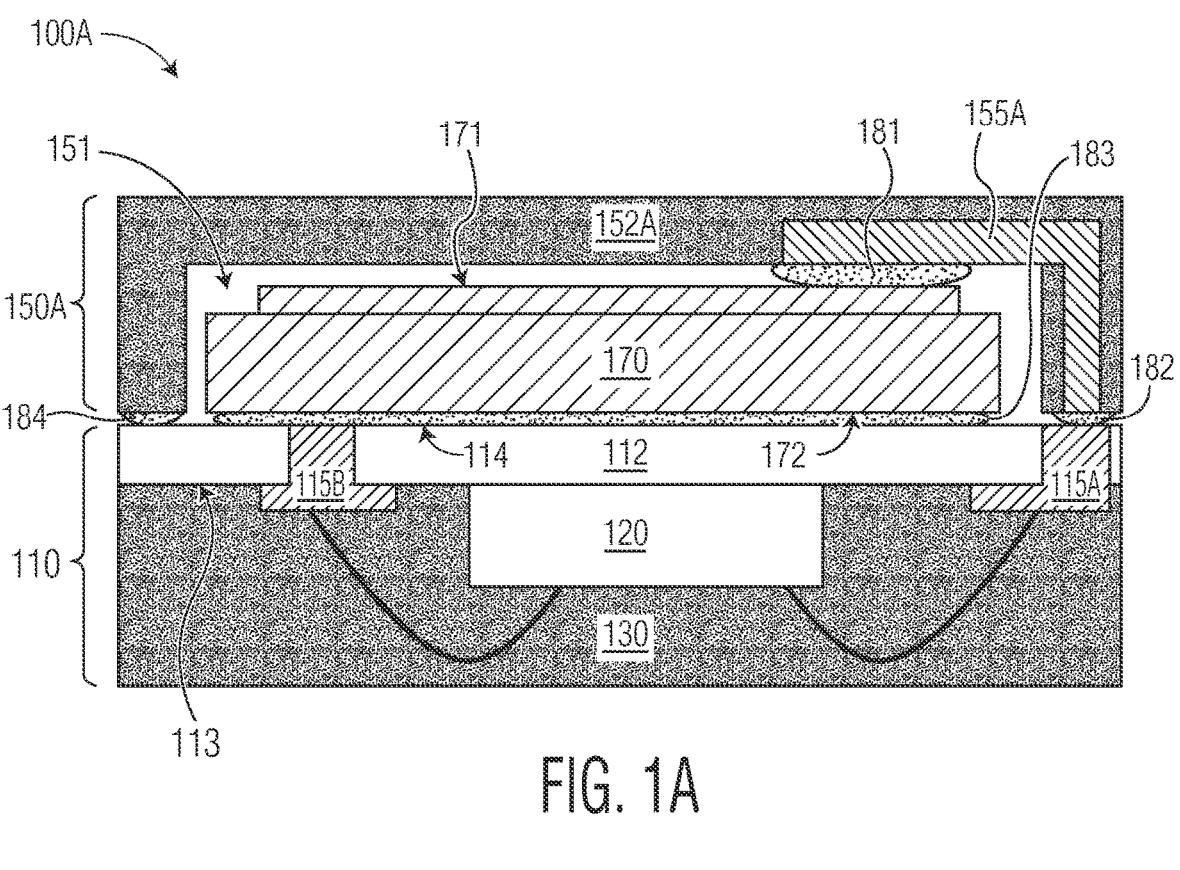
FIG. 1A is a cross-sectional view of a device package with an integrated battery according to one or more embodiments.

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation, and are made with reference to the orientation of the corresponding figure or figures for purposes of illustration.

It will be appreciated that the steps of various processes described herein are non-limiting examples of suitable processes according to embodiments and are for the purposes of illustration. Embodiments herein may use any suitable processes including those that omit steps of example processes described herein, perform those steps or similar steps in different orders, and the like. It will also be appreciated that well-known techniques and features may be omitted for clarity.

Unless explicitly stated otherwise, the terms "approximately" and "substantially", when used herein to refer to measurable quantities including, but not limited to dimensions, shall mean that a quantity is equal to a stated value or that two quantities are equal to each other to within an amount determined by accepted tolerances of the process(es) chosen to fabricate the relevant structure and/or an accepted measurement accuracy of the method(s) and/or measurement device(s) chosen to measure the dimensions or other properties described.

Mounting external batteries to packaged integrated circuits can add bulk to the device and can decrease its reliability; moreover, the step of mounting the battery from outside the device can add complexity to volume manufacturing processes. In addition, many so-called "coin" or "button" batteries used in consumer electronics cannot withstand high temperatures required in typical package assembly processes. Commonly available button batteries operate within a limited temperature range of about −40° to about +125° C. For instance, the melting point of lithium is 180° C., and the boiling temperature of electrolytes used in lithium batteries can range from 80° C. to 200° C. Exposing the batteries to the temperatures used in various stages to the semiconductor package assembly (e.g., molding temperatures above 175° C., wire bonding temperatures above 150° C., solder reflow temperatures above 260° C., and so on) can destroy the batteries or severely degrade their performance. In addition, many batteries are not suited for incorporation into conventional molded devices packages due to the tendency of batteries to swell and deform over time which can result in mechanical stresses in the package which can lead to mechanical and/or electrical failures.

Accordingly, embodiments described herein provide the ability to incorporate a common battery such as a coin or button battery into an electronic devices package without requiring the battery to be exposed to excessive temperatures experienced by the integrated circuit(s) during typical manufacturing processes. In addition, embodiments herein enable the manufacturing of such device packages with integrated batteries in high-volume "panel-level" assembly processes in which multiple devices are manufactured and assembled at once, followed by singulation into individual packaged devices. It will be understood that, although "coin" and/or "button" type batteries are described herein for ease of understanding, such batteries are non-limiting examples, and nothing herein is intended to limit embodiments to any specific battery form factor. Along these lines, one skilled in the relevant art will understand that embodiments herein can be adapted to accommodate batteries with different shapes, sizes, and with terminals arranged in any suitable configurations.

Along these lines, FIG. 1A shows a cross-sectional view of an example device package with an integrated battery according to one or more embodiments. The package 100A includes a device assembly 110 coupled to a battery assembly 150A. The device assembly includes an integrated circuit or other electronic component (represented by a die 120) that is bonded to a substrate 112. The substrate 112 has first and second surfaces (the lower surface 113 and the upper surface 114) and two contacts 115 (a contact 115a and contact 115b) which are exposed at (at least) the upper surface 114. The die 120 is coupled to each of the contacts 115 (e.g., by wire bonds, as shown in the example of FIG. 1A). The die 120 is encapsulated within a volume of molding material 130 which can form an exterior of the package 100A.

The molding material 130 and other molding materials described herein can be any combination of suitable polymer and/or elastomer materials including but not limited to epoxy-based compounds, silicone-based compounds, urethane-based compounds, and the like.

The battery assembly 150A includes a molded cover 152A which is bonded to the upper surface 114 of the substrate 112, forming a cavity 151. An electrically conductive lead 155A is incorporated into the molded cover 152A and has an exposed surface which is bonded to the battery 170 via a first battery terminal 171 (e.g., a positive terminal or a negative terminal of the battery 170). The battery terminal 171 and the lead 155A (which may be referred to as a "clip") are joined by an electrically-conductive bond 181 which can be formed using any suitable processes and materials. For instance, the electrically-conductive bond 181 can be a volume of electrically-conductive adhesive (an "ECA" such as silver-loaded epoxy as a nonlimiting example); a solder bond formed using a suitable low-temperature soldering process; or a weld formed using a suitable welding process which does not excessively heat the bulk of the battery 170.

As shown, the lead 155A is also exposed near the upper surface 114 of the substrate 112 where it is joined to the substrate via an electrically-conductive bond 182 which bonds the lead 155A (and the molded cover 152A with it) to the substrate 112 via the contact 115a, effectively electrically coupling the terminal 171 of the battery 170 to the die 120 via the contact 115a. A cover such as the cover 152A can be bonded to a substrate via additional bonds such as the bond 184 which can be made using any suitable process and any suitable material. For example, the bond 184 can be made using the same material as the bond 182, and/or the bond 181 or a different material (e.g., the bonds 181, 182 are electrically conductive, but the bond 184 can be electrically conductive or insulating). The terminal 172 of the battery 170 (e.g., a negative battery terminal or a positive terminal of the battery 170) is bonded to the contact 115b (and optionally to an additional portion of the substrate 112 surrounding the contact 115b) via another electrically conductive bond 183 which can be the same material as either of the electrically conductive bonds 181, 182 or another suitable material.

It will be understood that, electrically conductive bonds such as those described above in connection with FIG. 1A and FIG. 1B and below in connection with subsequent figures may be formed using any suitable low-temperature bonding agent, which may be described as electrically conductive adhesive (ECA). The ECA may be any suitable ECA that is compatible with both electronic components (e.g., semiconductor die such as the die 120), batteries such as the as the battery 170, and leads such as the conductive leads 155A, 155B. In one or more embodiments, it is desirable to use an ECA that is curable at temperatures at or below approximately 80° C., including silver-loaded epoxy compounds and silver-filled modified silicone ("MS") polymer compounds as non-limiting examples.

Further, suitable low temperature bonding agents are not limited to ECAs, and the disclosure contemplates any suitable alternative material that is conductive, is workable at temperatures that will not damage a battery or other components and forms a permanent bond between. For example, a bonding agent may be a low-temperature solder paste or solder alloy (e.g., tin/bismuth); and steps of depositing and curing an ECA may be replaced with, for example, the steps of flowing the solder into the channels and allowing it to cool once the battery is mounted. Molding materials may be any non-conductive material that is suitable for encapsulating electronics packages and workable at the described low temperatures. Non-limiting examples of such molding materials include silicone potting material, various thermoplastic polymers, UV-curable damming or filling materials, and the like.

Figures 2A, 2B:
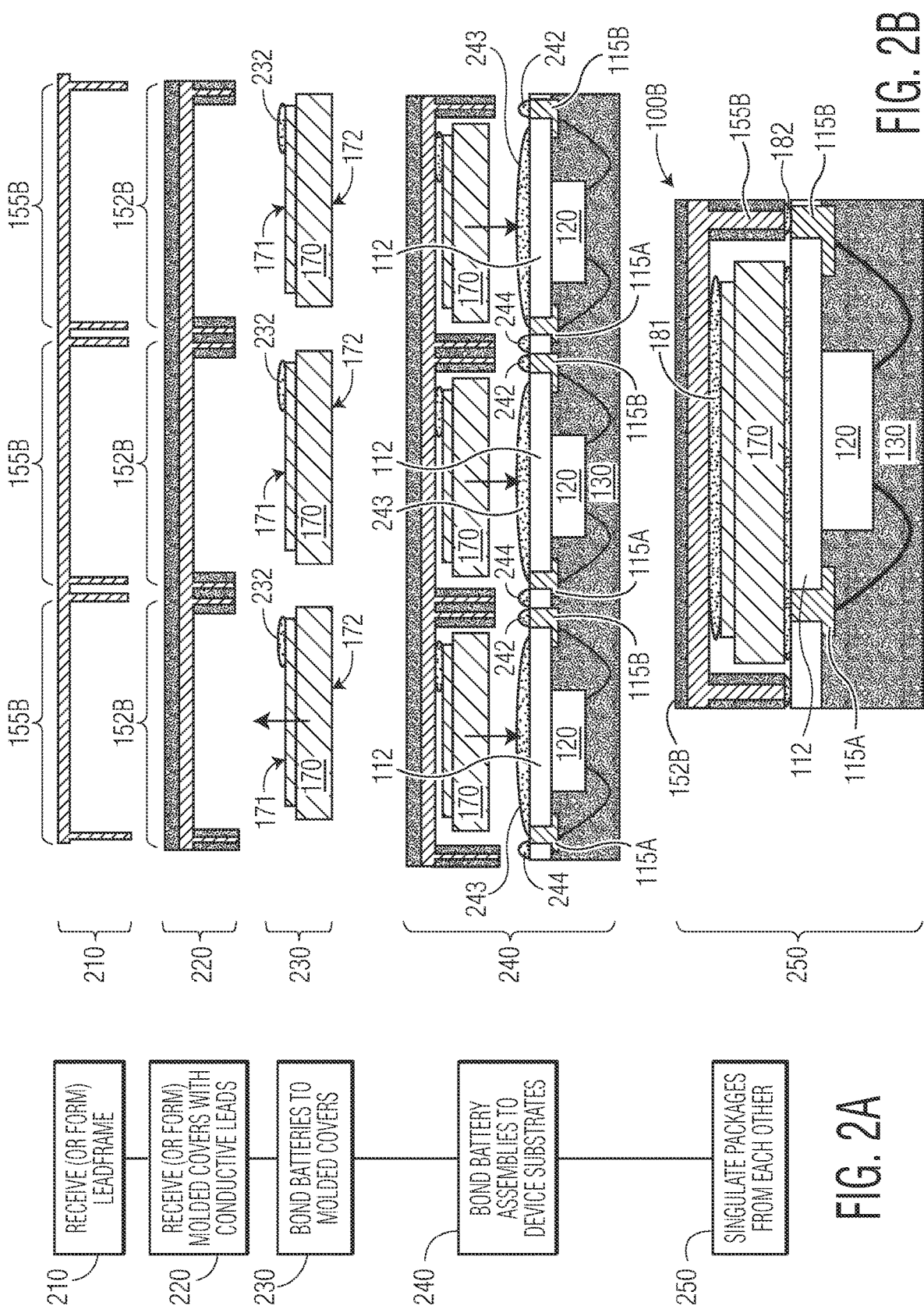
FIG. 2A is a process flow diagram corresponding to an example process suitable for use in assembly of a device package of FIG. 1A or FIG. 1B.
FIG. 2B depicts cross-sectional views corresponding to steps of the process of FIG. 2A.

FIG. 2A is a process diagram showing steps in an example process suitable for use in fabricating a package such as the package 100A or 100B according to one or more embodiments. The process 200 has steps 210, 220, 230, 240, 250, and 260 which are described in connection assembly of the package 100B and illustrated in FIG. 2B. It will be appreciated that, in one or more embodiments, a package such as the package 100A or 100B is fabricated in a related process which may omit one or more steps of the process 200 or similar steps, perform steps of the process 200 or similar in a different order, or add steps not explicitly described in connection with the process 200. It will be further understood that well-known process steps may not be described and that multiple processing steps may be described as part of a single step of the process 200 for ease of understanding.

It will be understood that the process 200 is a so-called panel-level process in which multiple device packages can be formed in parallel which are ultimately singulated into individual device packages. However, nothing herein is intended to require devices and packages according to embodiments herein to being fabricated using panel-level processes as opposed to being formed individually.

At step 210, a leadframe 212 is received which includes multiple conductive leads 155B joined together. It will be appreciated that the structure of an individual conductive lead 155B is conducive to being formed as part of a single connected leadframe 212 which can be singulated at any appropriate time. In one or more embodiments, a process such as the process 200 includes an additional step of fabricating a leadframe such as the leadframe 212.

At step 220, the leadframe 212 is molded as to form multiple molded covers 152B, which are shown still joined together. It will be appreciated that in one or more embodiments, a process such as the process 200 is modified to form molded covers 152A rather than the molded covers 152B. In some such embodiments, one or more additional steps may be required in order to a form a panel-level assembly of covers 152A in which the conductive leads 152A are not connected to each other as are the conductive leads 152B as shown in FIG. 2B. For example, after singulation of the package 100B as shown in FIG. 2B, a conductive lead such as the conductive lead 155B may be exposed at the edges to make connection with the battery terminal 171 and covered with epoxy or any other suitable insulating material on the exterior sides to prevent shorting the battery terminals 171, 172 if desired.

Figure 1B:
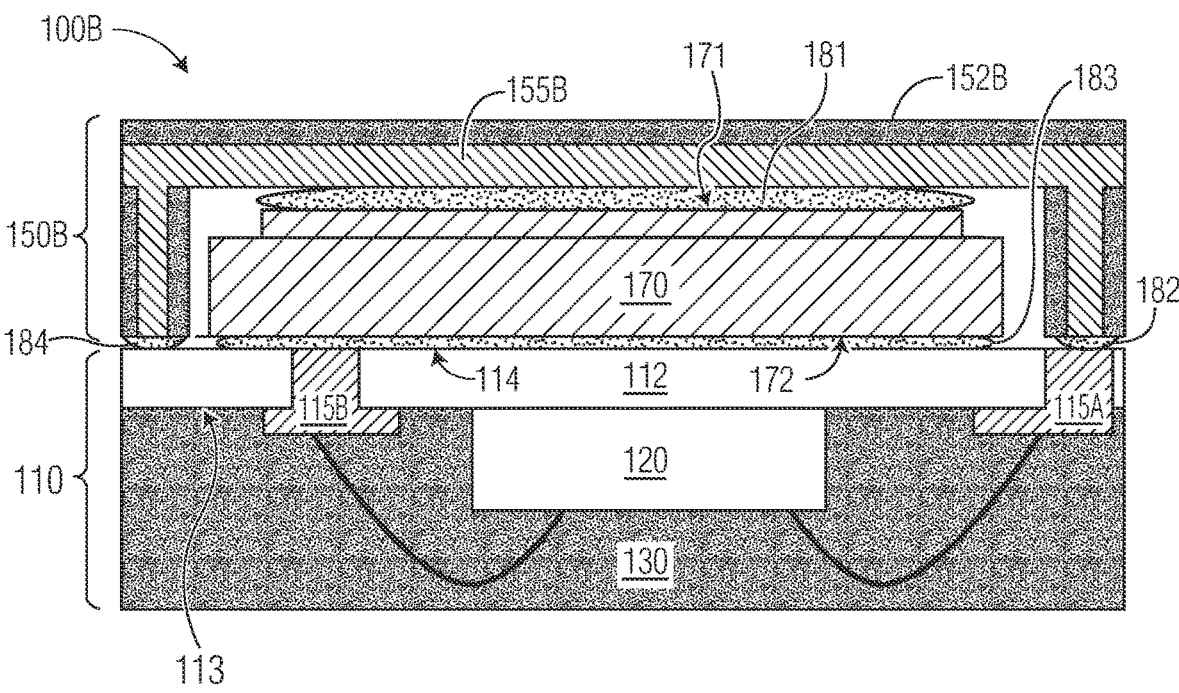
FIG. 1B is a cross-sectional view of a device package according to one or more embodiments with an integrated battery that is related to the package of FIG. 1A.

At step 230, an electrically-conductive bond (e.g., the electrically-conductive bond 181) is formed between each battery 170 and the corresponding conductive lead (e.g., the conductive lead 155B as shown, or the conductive lead 155A as shown in FIG. 1A). In the example of FIG. 2B, an ECA 232 is applied to the terminal 171 of the battery 170 and then the battery 170 is brought into contact with the conductive lead via the ECA 171 which is cured to form the electrically-conductive bond. It will be understood that conductive bonds such as the electrically-conductive bond 181 can be formed in any suitable manner and that the process described in connection with FIG. 2B is a nonlimited example. For instance, the electrically-conductive bond 181 can be formed by applying the ECA 232 to the conductive lead 155B first, rather than to the battery 170. In addition, the electrically-conductive bond 181 can be formed by any suitable processes, including, but not limited to a suitable welding, soldering, sintering, or curing processes. The area of the electrically-conductive bond 181 can be limited to a portion of the terminal 171 of the battery 170 as shown, or it can be larger (e.g., as shown in FIG. 1B).

At step 240, respective conductive bonds are formed that couple the conductive lead (e.g., the conductive lead 155A or 152B to one of the contacts 115 on the substrate 112 (e.g., the electrically-conductive bond 182 coupling the cover 152A to the substrate 112 and the conductive lead to the contact 115). Another bond (which can be conductive or nonconductive is formed, coupling the cover 152A to the substrate 112 (e.g., the bond 184). Another conductive bond is formed, bonding the battery 170 to the substrate 112 and also electrically coupling the terminal 172 of the battery 170 to the contact 115*b* (e.g., the electrically-conductive bond 183). In the example of FIG. 2B, formation of the electrically-conductive bond s 182 and 183, as well as the bond 184 (which can be conductive or nonconductive) is represented by ECA 242, ECA 243 and adhesive 244 (which can be an ECA or a nonconductive adhesive) applied to the substrate 112 as shown.

Afterward the battery assembly 150A is brought into contact with the substrate 112 and the adhesives are cured. As above, it will be appreciated that the electrically-conductive bond s formed are shown and described as being formed by adhesives for purposes of illustration and any suitable bonding processes can be used to form conductive bonds according to embodiments herein, as described above in connection with the electrically-conductive bond 181.

Final, at step 250, the package 100B is singulated from the other identical or similar assemblies using any suitable process including, but not limited to, sawing, laser cutting, water jetting or the like.

Figure 3:
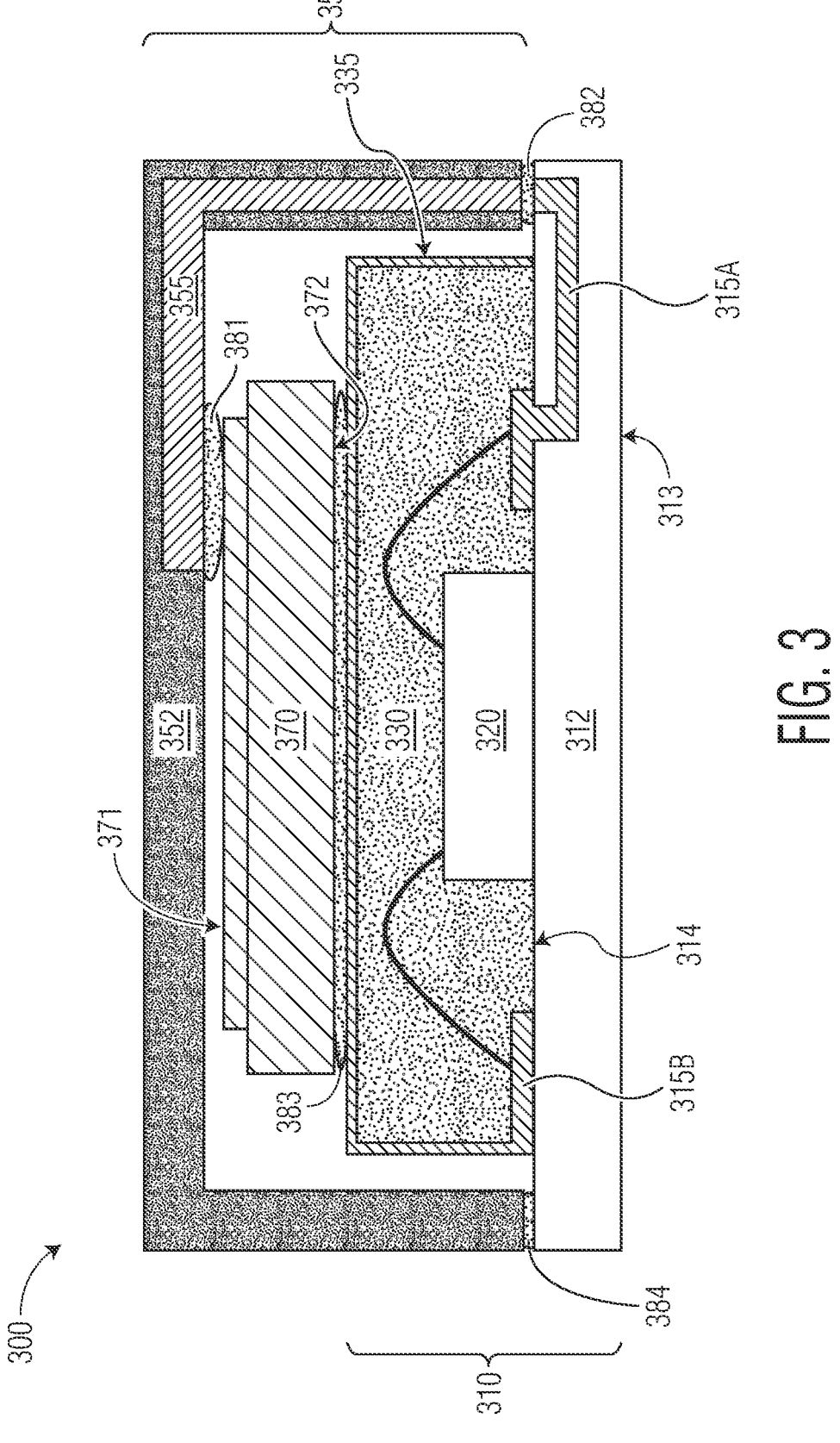
FIG. 3 is a cross-sectional view of another device package with an integrated battery according to one or more embodiments.

FIG. 3 is cross-sectional view of another example package according to one or more embodiments. As illustrated by the package 300 as shown in FIG. 3, in one or more embodiments a die such as the die 320 (e.g., a die 120) can be disposed on the same side of a substrate as a battery. Specifically, the die 320 is disposed on the upper surface 314 rather than the lower surface 313 of the substrate 312 (e.g., a substrate 112) and the battery 370 (e.g., a battery 170) is stacked above the die 320 as described below.

The die 320 is coupled to the contacts 315*a*, 315*b* (e.g., contacts 115*a*, 115*b*) disposed on the upper surface 314 of the substrate 312. In the example of FIG. 3, the die 320 is coupled to the contacts 315*a*, 315*b* via wire bonds but it will be understood that any suitable methods may be used to couple a die such as the die 320 to contacts such as one or more contacts 315. The die 320 is encapsulated within a volume of molding material 330 (e.g., a molding material 130) and an electrically-conductive extended contact 335 overlies the volume of molding material 330 and is electrically coupled to the contact 315*b*. Such an extended metal contact can be formed using any suitable methods including, but not limited to sputtering processes, thermal evaporation processes, plating processes, and the like. The arrangement of the extended metal contact 335 allows the terminal 371 battery 370 to be coupled to the contact 315*a* via the conductive lead 355 (e.g., a conductive lead 155A or 155B) and to the contact 315*b* via the extended metal contact 335 as shown. As shown, in one or more embodiments, a contact such as the contact 315*a* can be routed within a substrate such as the substrate 312 to facilitate coupling of the conductive lead 355 to the contact 315*a* without causing undesirable electrical context between the contact 315*a* and the extended contact 335, which could result in shorting the terminals 371, 372 of the battery 370 to each other.

In the example of FIG. 3, the terminal 371 of the battery 370 is bonded to the molded cover 352 (and electrically coupled to the contact 315*a* via the conductive lead 355) via an electrically-conductive bond 381 (e.g., an electrically-conductive bond 181). The molded cover 352 is bonded to the substrate by the electrically-conductive bond 382 (e.g., the electrically-conductive bond 182) which also electrically couples the conductive lead 355 to the contact 315*a*) and by the bond 384, which can be conductive or nonconductive (e.g., the bond 184). Meanwhile, the terminal 372 of the battery 370 is electrically coupled to the contact 315*b* via the electrically-conductive bond 383 (e.g., the electrically-conductive bond 183). As above, the various electrically-conductive bonds 381, 382, 383 can be formed via an ECA such as a conductive epoxy which is cured in place or any other suitable bonding material including solder materials, sintered materials, and the like or by an interface between two materials formed by welding or another similar process. Generally, the package 300 can be formed in a process related to the process 200 in which a device assembly 310 that includes the substrate 312 and the die 320 is bonded to a battery assembly 350 that includes the molded cover 352 and the battery 370.

Figures 4A, 4B:
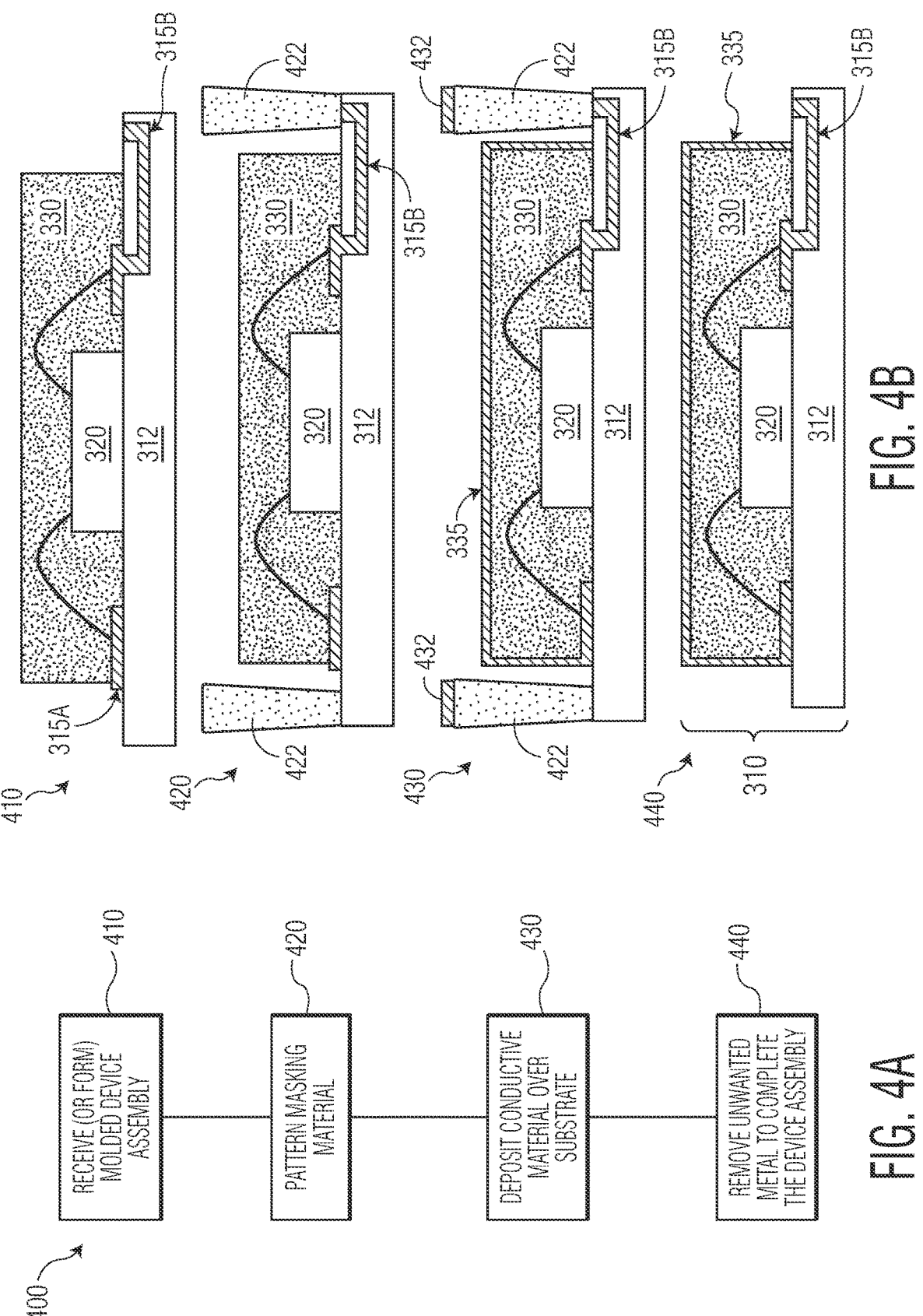
FIG. 4A is a process flow diagram corresponding to an example process suitable for use in assembly of a portion of the package of FIG. 3.
FIG. 4B depicts cross-sectional views corresponding to steps of the process of FIG. 4A.

Along these lines, FIG. 4A and FIG. 4B illustrate an example process suitable for fabricating a device assembly such as the device assembly 310 of FIG. 3 according to one or more embodiments. FIG. 4A is a process diagram showing steps in the process 400 which has steps 410, 420, 430, 440 which are described in connection with forming the device assembly 310 as illustrated in FIG. 4B.

It will be appreciated that in one or more embodiments, a device assembly such as the device assembly 310 is fabricated in a related process which may omit one or more steps of the process 400 or similar steps, include steps of the process 400 or similar in a different order, or add steps not explicitly described in connection with the process 400. It will be further understood that well-known process steps may not be described and that multiple processing steps may be described as part of a single step of the process 400 for ease of understanding.

At step 410, a partial device assembly 310 is received which includes the substrate 312, the contacts, 315, and the die 320, shown already encapsulated within the volume of molding material 330. In one or more embodiments, a process such as the process 400 includes additional steps of fabricating one or more of the substrates 312 and the die 320, coupling the die 320 to the contacts 315 (e.g., by wire bonding, ball bonding, solder reflow, sintering, curing, or any other suitable process) and/or encapsulated the die 320 within the volume of molding material 330.

At step 420, a masking material 422 (e.g., photoresist or another suitable sacrificial material) is patterned on the substrate 312 as shown. The patterned masking material 422 can be used to protect portions of the substrate 312 from subsequent deposition of metal or other conductive material where that material is not desired. At step 430, an electrically conductive material 432 (e.g., any suitable metal or any other suitably electrically conductive material) is deposited or otherwise formed over the substrate 312 as shown (e.g., via sputtering, thermal evaporation, electroplating, or any other suitable process) including a portion of the conductive material 432 forming the electrically-conductive extended contact 335.

At step 440, the masking material 422 is removed by any suitable process (e.g., a wet chemical etching process or a dry plasma etching process), removing the unwanted conductive material 432, and leaving the completed device assembly 310 as shown. As shown in FIG. 4, the masking material 422 can have a tapered or "undercut" profile which can facilitate removal of the unwanted conductive material 432 via a "lift-off" process. It will be understood that the process 400 is an example for purposes of illustration and that any suitable process may be used to form an extended contact such as the extended contact 335. As one example, the extended contact 335 could also be formed by a subtractive process in which the conductive material 432 is deposited over the entire substrate 312 and then selectively removed from areas where the conductive material is not desired to leave the extended contact 335.

It will be understood that, although the process 400 is depicted in FIG. 4B as a process in which a single device assembly 310 is formed, the process 400 can also be performed as panel-level process in which multiple identical or similar assemblies are formed at once, followed by singulation at any appropriate step or as part of a subsequent process.

It will be understood that the example embodiments illustrated and described herein are intended as non-limiting examples. For instance, embodiments herein can include any suitable number of die (e.g., die 120, 320) and any suitable number of batteries, in any suitable arrangement. As one nonlimiting example, a package according to one or more embodiments can include one or more die disposed adjacent to each other on a single substrate (e.g., a substrate 112 or 312). As another non-limiting example, a package can include one or more die on both an upper surface and a lower surface of the substrate.

Figure 5:
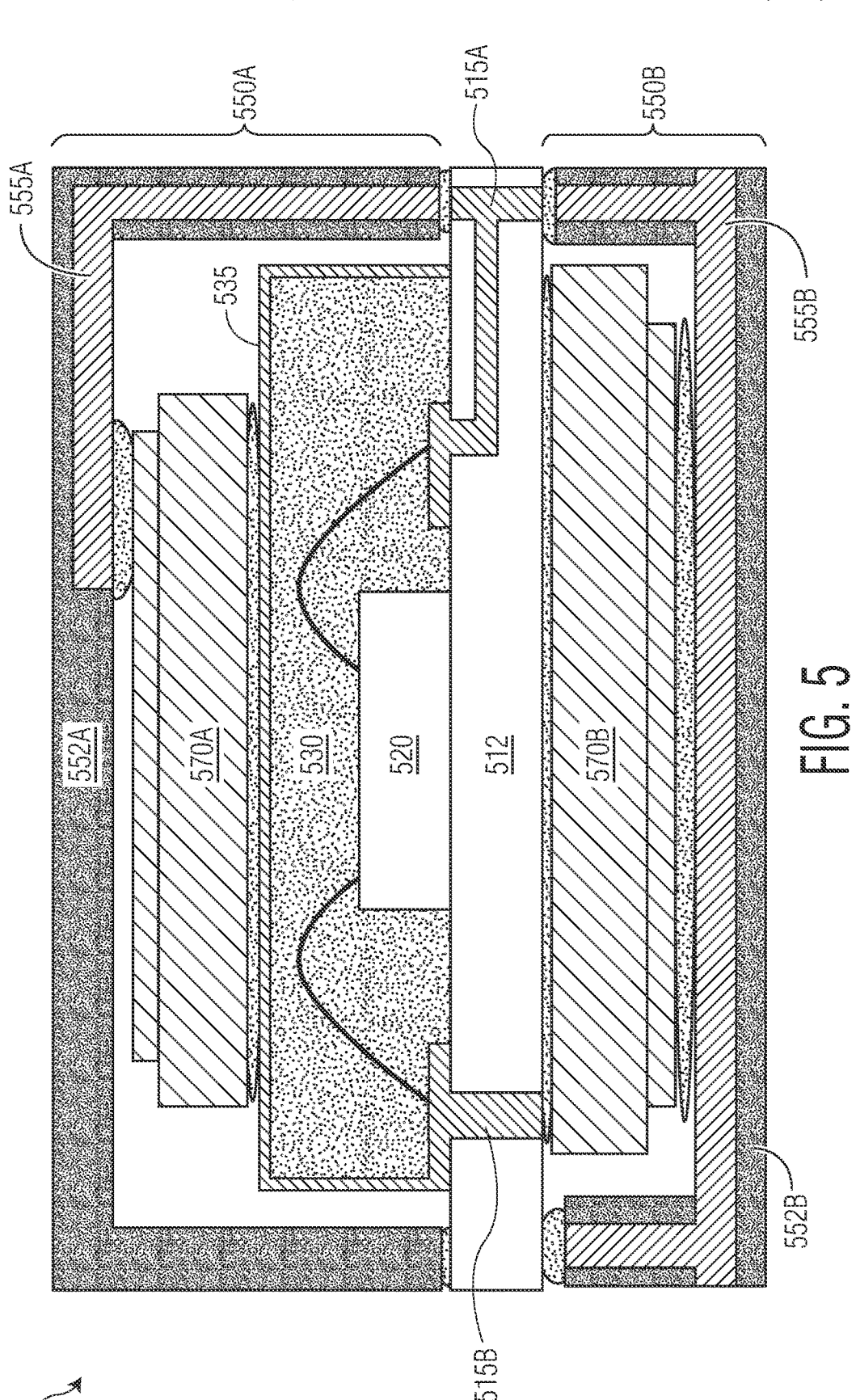
FIG. 5 is a cross-sectional view of another device package with two integrated batteries that includes features related to features of the packages of FIG. 1A, FIG. 1B, and FIG. 3.

As yet another non-limiting example, a package can include one or more die on both an upper surface and a lower surface of the substrate by combining features of a package such as the package 100A or 100B with features of a device assembly such as the device assembly 310. Along similar lines, in one or more embodiments, a package can include a first battery assembly (e.g., a battery assembly 150A, a battery assembly 150B, or a related battery assembly) on a first surface of a substrate and a second battery assembly (e.g., the battery assembly 350 or a related assembly) on an opposite surface of the substrate with appropriately routed contacts, as shown in the example package 500 of FIG. 5. For ease of understanding, descriptions pf features of the package 500 that are related to features previously described in connection with FIG. 1A, 1B, 2A, 2B, 3, 4A, or 4B are omitted.

The package 500 includes a substrate 512 (e.g., a substrate 112 or 312) with a die 520 (e.g., a die 120, 320) encapsulated in a volume of molding material 530 (e.g., molding material 130 or 330) with an extended contact 535 (e.g., an extended contact 335) disposed above the volume of molding material 530. A battery assembly 550A (e.g., the battery assembly 350) fitted with a battery 570A is coupled to the upper surface 514 of the substrate 512 and the battery 570A is coupled to the die 520 via the contacts 515a and 515b analogously to how the battery 370 is coupled to the die 320 via the contacts 315a, 315b). Meanwhile a second battery assembly 550B (e.g., a battery assembly 150A or 150B) fitted with a battery 570B is coupled to the lower surface 513 of the substrate 512 and the battery 570B is coupled to the die 520 via the contacts 515a and 515b analogously to how the battery 170 is coupled to the die 120 via the contacts 315a, 315b).

VARIOUS EXAMPLES

Features of embodiments may be understood by way of one or more of the following examples:

Example 1: A device package or method of forming a device package that includes a carrier substrate having an upper surface and a lower surface. The carrier substrate has a first electrical contact and a second electrical contact. An electronic device die is bonded to upper surface or the lower surface of the carrier substrate and the electronic device die is electrically coupled to the first electrical contact and the second electrical contact. A molded cover is bonded to the carrier substrate that forms a cavity above the upper surface of the carrier substrate. The device package includes a battery having a first terminal bonded to the molded cover and a second terminal; and a first conductive lead embedded within the molded cover that electrically couples the first terminal of the battery to the first contact pad.

Example 2: The device package of Example 1, where the first terminal of the battery is bonded to an exposed surface of the conductive lead that is exposed within the cavity.

Example 3: The device package or method of Example 1 or Example 2, where the first and second electrical contacts are exposed on the upper surface of the carrier substrate; and where the electronic device is bonded to the lower surface of the carrier substrate and electrically coupled to the first contact pad and the second contact via electrical interconnections that pass through the carrier substrate.

Example 4: The device package or method of any one of Examples 1-3, where the first terminal of the battery is bonded to the exposed surface of the electrically conductive lead by a volume of electrically conductive adhesive material.

Example 5: The device package or method of any one of Examples 1-4, further including a first electrically conductive bond that electrically couples the first conductive lead to the first contact pad and bonds the molded cover to the upper surface of the carrier substrate.

Example 6: The device package or method of any one of Examples 1-5 where the first electrically-conductive bond is formed by an electrically-conductive adhesive material, a low-temperature solder bond, or a welded joint.

Example 7: The device package or method of any one of Examples 1-6, where the electronic device is bonded to the upper surface of the carrier substrate; and where the device package further include a second electrically conductive lead that is coupled to the second electrically conductive contact, the second electrically conductive leas being disposed between the electronic device and the battery within the cavity; and where the second terminal of the battery is bonded to a surface of the second electrically conductive lead.

Example 8: The device package or method of any one of Examples 1-7, where the electronic device is encapsulated within a volume of molding material; and where the second conductive lead is formed over the volume of molding material.

Example 9: The device package or method of any one of Examples 1-8, where the second terminal of the battery is bonded to the carrier substrate via an electrically-conductive bond that electrically couples the second terminal of the battery to the second electrical contact.

Example 10: The device package or method of any one of Examples 1-9 where the electrically-conductive bond that electrically couples the second terminal of the battery to the second electrical contact is formed by an electrically-conductive adhesive material, a low-temperate solder bond, or a welded joint.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent exemplary functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in one or more embodiments of the depicted subject matter.

What is claimed is:

1. A device package, comprising:
a carrier substrate having an upper surface and a lower surface that includes a first electrical contact and a second electrical contact;
an electronic device die bonded to upper surface or the lower surface of the carrier substrate, wherein the electronic device die is electrically coupled to the first electrical contact and the second electrical contact; and
a molded cover bonded to the carrier substrate that forms a cavity above the upper surface of the carrier substrate;
a battery having a first terminal bonded to the molded cover and a second terminal; and
a first conductive lead embedded within the molded cover that electrically couples the first terminal of the battery to the first contact pad;
wherein the first terminal of the battery is bonded to an exposed surface of the conductive lead that is exposed within the cavity,
wherein the electronic device die is bonded to the upper surface of the carrier substrate; and
wherein the device package further comprises a second electrically conductive lead that is coupled to the second electrically conductive contact, the second electrically conductive lead being disposed between the electronic device and the battery within the cavity; and
wherein the second terminal of the battery is bonded to a surface of the second electrically conductive lead.

2. The device package of claim 1,
wherein the first and second electrical contacts are exposed on the upper surface of the carrier substrate; and
wherein the electronic device is bonded to the lower surface of the carrier substrate and electrically coupled to the first contact pad and the second contact via electrical interconnections that pass through the carrier substrate.

3. The device package of claim 2, wherein the first terminal of the battery is bonded to the exposed surface of the electrically conductive lead by a volume of electrically conductive adhesive material.

4. The device package of claim 1, further comprising a first electrically conductive bond that electrically couples the first conductive lead to the first contact pad and bonds the molded cover to the upper surface of the carrier substrate.

5. The device package of claim 4 wherein the first electrically-conductive bond is formed by an electrically-conductive adhesive material, a low-temperate solder bond, or a welded joint.

6. The device package of claim 1,
wherein the electronic device is encapsulated within a volume of molding material; and
wherein the second conductive lead is formed over the volume of molding material.

7. The device package of claim 1,
wherein the second terminal of the battery is bonded to the carrier substrate via an electrically-conductive bond that electrically couples the second terminal of the battery to the second electrical contact.

8. The device package of claim 7 wherein the electrically-conductive bond that electrically couples the second terminal of the battery to the second electrical contact is formed by an electrically-conductive adhesive material, a low-temperate solder bond, or a welded joint.

9. A method of forming a device package, the method comprising:
receiving a carrier substrate having an upper surface and a lower surface, wherein the carrier substrate includes:
a first electrical contact and a second electrical contact; and
an electronic device die bonded to upper surface or the lower surface of the carrier substrate, wherein the electronic device die is electrically coupled to the first electrical contact and electrically coupled to the second electrical contact;
bonding a molded cover bonded to the carrier substrate that forms a cavity above the upper surface of the carrier substrate, wherein a battery having a first and a second terminal is bonded to the molded cover within the cavity; and
wherein a first conductive lead is embedded within the molded cover that electrically couples the first terminal of the battery to the first contact pad;
wherein the first terminal of the battery is bonded to an exposed surface of the conductive lead that is exposed within the cavity;
wherein the electronic device die is bonded to the upper surface of the carrier substrate; and
wherein the device package further comprises a second electrically conductive lead that is coupled to the second electrically conductive contact, the second electrically conductive lead being disposed between the electronic device die and the battery within the cavity; and wherein the second terminal of the battery is bonded to a surface of the second electrically conductive lead.

10. The method of claim 9,
wherein the first and second electrical contacts are exposed on the upper surface of the carrier substrate; and
wherein the electronic device is bonded to the lower surface of the carrier substrate and electrically coupled to the first contact pad and the second contact via electrical interconnections that pass through the carrier substrate.

11. The method package of claim 10, wherein the first terminal of the battery is bonded to the exposed surface of the electrically conductive lead by a volume of electrically conductive adhesive material.

12. The method of claim 9, further comprising a first electrically conductive bond that electrically couples the first conductive lead to the first contact pad and bonds the molded cover to the upper surface of the carrier substrate.

13. The method of claim 12 wherein the first electrically-conductive bond is formed by an electrically-conductive adhesive material, a low-temperate solder bond, or a welded joint.

14. The method of claim 9, wherein the electronic device is encapsulated within a volume of molding material; and wherein the method further comprises forming the second conductive lead over the volume of molding material.

15. The device package of claim 9, wherein the second terminal of the battery is bonded to the carrier substrate via an electrically-conductive bond that electrically couples the second terminal of the battery to the second electrical contact.

16. The device package of claim 15 wherein the electrically-conductive bond is formed by an electrically-conductive adhesive material, a low-temperate solder bond, or a welded joint.

* * * * *